US011521837B2

(12) United States Patent
Koiwa

(10) Patent No.: US 11,521,837 B2
(45) Date of Patent: Dec. 6, 2022

(54) STAGE AND SUBSTRATE PROCESSING APPARATUS

(71) Applicant: Tokyo Electron Limited, Tokyo (JP)

(72) Inventor: Shingo Koiwa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 358 days.

(21) Appl. No.: 16/797,176

(22) Filed: Feb. 21, 2020

(65) Prior Publication Data

US 2020/0273680 A1 Aug. 27, 2020

(30) Foreign Application Priority Data

Feb. 25, 2019 (JP) .............................. JP2019-032009

(51) Int. Cl.
*H01J 37/32* (2006.01)
*H02N 13/00* (2006.01)
*H01L 21/683* (2006.01)

(52) U.S. Cl.
CPC .. *H01J 37/32724* (2013.01); *H01J 37/32642* (2013.01); *H01J 37/32697* (2013.01); *H01L 21/6831* (2013.01); *H02N 13/00* (2013.01)

(58) Field of Classification Search
CPC ........... H01J 37/32724; H01J 37/32642; H01J 37/32697; H01J 37/32715; H01J 2237/334; H01L 21/6831; H01L 21/6833; H01L 21/67069; H02N 13/00; C23C 16/4585; B23Q 3/15
See application file for complete search history.

(56) References Cited

U.S. PATENT DOCUMENTS

| 2009/0044751 A1* | 2/2009 | Park ................... H01L 21/68735 |
| | | 118/723 R |
| 2010/0040768 A1* | 2/2010 | Dhindsa ............ H01J 37/32724 |
| | | 427/248.1 |
| 2015/0053348 A1* | 2/2015 | Nagayama .......... H01J 37/3266 |
| | | 118/723 R |
| 2018/0166312 A1* | 6/2018 | Kimball .................. H01J 37/00 |

FOREIGN PATENT DOCUMENTS

| JP | 2005-064460 | 3/2005 |
| JP | 2014-053481 | 3/2014 |
| JP | 2017-055100 | 3/2017 |
| JP | 2019-016704 | 1/2019 |

* cited by examiner

*Primary Examiner* — Renan Luque
(74) *Attorney, Agent, or Firm* — IPUSA, PLLC

(57) ABSTRACT

There is provision of a stage including a base; a substrate mount section provided above an upper surface of the base; an annular member mount section provided above the upper surface of the base, so as to surround a periphery of the substrate mount section; a first bonding layer bonding the base and the substrate mount section; a second bonding layer bonding the base and the annular member mount section; an annular member disposed on the annular member mount section; and a sealing member configured to protect the first bonding layer and the second bonding layer.

18 Claims, 6 Drawing Sheets

STAGE AND SUBSTRATE PROCESSING APPARATUS

CROSS-REFERENCE TO RELATED APPLICATIONS

This patent application is based on and claims priority to Japanese Patent Application No. 2019-032009 filed on Feb. 25, 2019, the entire contents of which are incorporated herein by reference.

TECHNICAL FIELD

The present disclosure relates to a stage and a substrate processing apparatus.

BACKGROUND

There is known a plasma processing apparatus including a base, an electrostatic chuck, and a bonding layer that bonds the base to the electrostatic chuck.

Patent Document 1 discloses a plasma etching apparatus including a base, an electrostatic chuck disposed on a mounting surface of the base and configured to place an object, and a bonding layer that bonds the base to the electrostatic chuck.

CITATION LIST

[Patent Document]
[Patent Document 1] Japanese Laid-open Patent Application Publication No. 2014-053481

SUMMARY

In one aspect, the present disclosure provides a stage that is configured to protect a bonding layer, and a substrate processing apparatus.

According to one aspect of the present disclosure, there is provision of a stage including a base; a substrate mount section provided above an upper surface of the base; an annular member mount section provided above the upper surface of the base, so as to surround a periphery of the substrate mount section; a first bonding layer bonding the base and the substrate mount section; a second bonding layer bonding the base and the annular member mount section; an annular member disposed on the annular member mount section; and a sealing member configured to protect the first bonding layer and the second bonding layer.

DETAILED DESCRIPTION OF EMBODIMENTS

In the following, embodiments of the present disclosure will be described with reference to the drawings. Note that in the following drawings, the same components are given to the same reference symbols, and overlapping descriptions may be omitted.

First Embodiment

Figure 1:
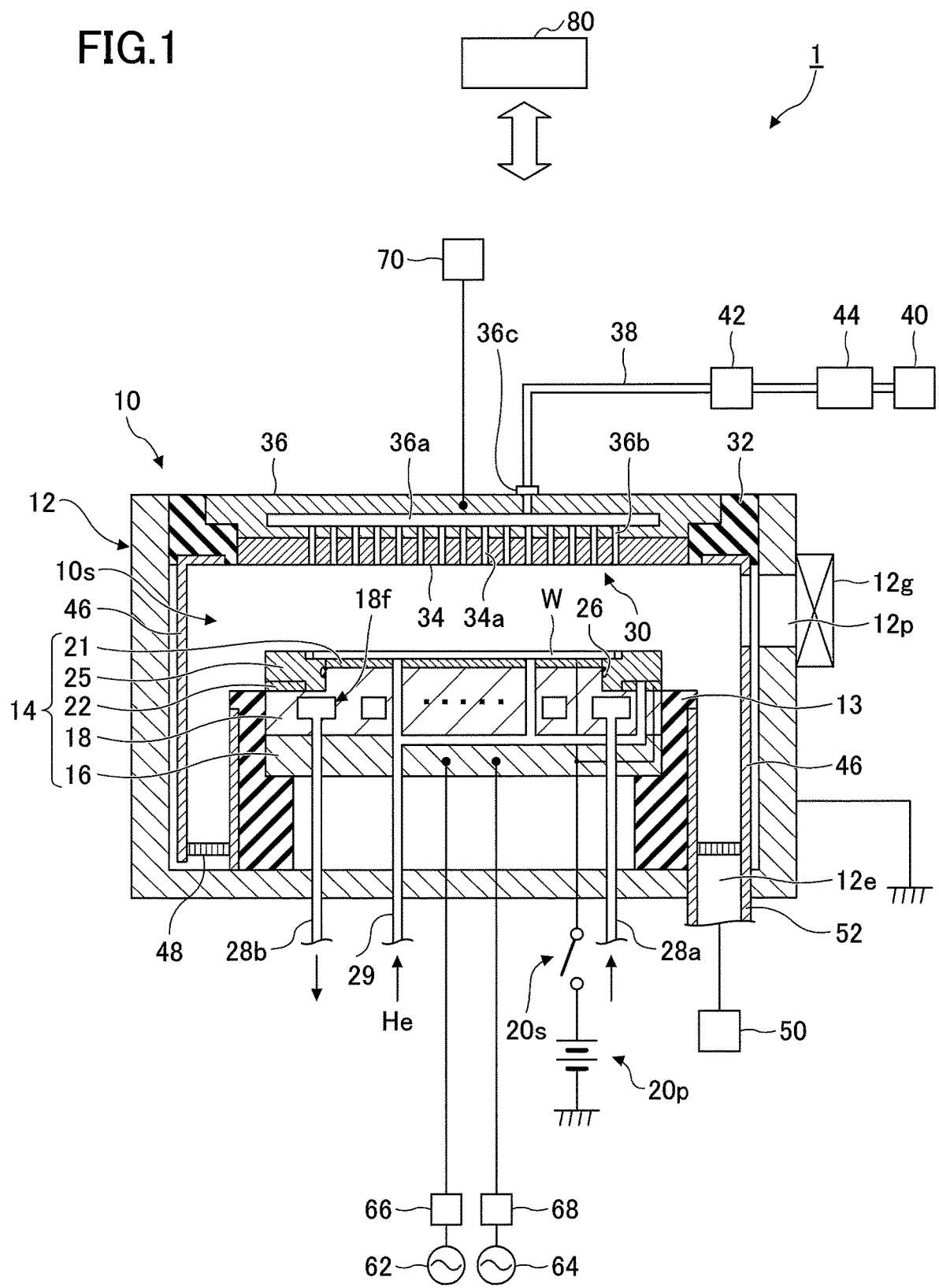
FIG. 1 is a cross-sectional view illustrating an example of a substrate processing apparatus according to a first embodiment.

A substrate processing apparatus 1 according to a first embodiment will be described with reference to FIG. 1. FIG. 1 is a cross-sectional diagram illustrating an example of a substrate processing apparatus 1 according to the first embodiment.

The substrate processing apparatus 1 includes a chamber 10. The chamber 10 provides an interior space 10s therein. The chamber 10 includes a chamber body 12. The chamber body 12 has a generally cylindrical shape. The chamber body 12 is made of, for example, aluminum. A corrosion resistant film is provided on an inner wall of the chamber body 12. The film may be a ceramic such as aluminum oxide or yttrium oxide.

A passage 12p is formed on a side wall of the chamber body 12. A substrate W is conveyed between the interior space 10s and an exterior of the chamber 10 through the passage 12p. The passage 12p is opened and closed with a gate valve 12g provided along the side wall of the chamber body 12.

A support section 13 is provided on the bottom of the chamber body 12. The support section 13 is formed of an insulating material. The support section 13 has a generally cylindrical shape. The support section 13 extends upwardly from a bottom of the chamber body 12 in the interior space 10s. At an upper portion of the support section 13, a stage 14 is provided. The stage 14 is configured to support (mount) the substrate W in the interior space 10s.

The stage 14 includes a lower electrode (base) 18, a first electrostatic chuck (substrate mount section) 21, and a second electrostatic chuck (annular member mount section) 22. The stage 14 may further include an electrode plate 16. The electrode plate 16 is made from a conductor such as aluminum, and is formed in a substantially disk-like shape. The lower electrode 18 is disposed on the electrode plate 16. The lower electrode 18 is made from a conductor such as aluminum, and is formed in a substantially disk-like shape. The lower electrode 18 is electrically connected to the electrode plate 16.

A first electrostatic chuck 21 is provided on the lower electrode 18. The substrate W is placed on an upper surface of the first electrostatic chuck 21. The first electrostatic chuck 21 includes a body and an electrode. The body of the first electrostatic chuck 21 is formed in a substantially disk-like shape, and is made from a dielectric material. The electrode of the first electrostatic chuck 21 is a film-like electrode, and is embedded in the body of the first electrostatic chuck 21. The electrodes of the first electrostatic chuck 21 are connected to a direct current (DC) power supply 20p via a switch 20s. When voltage from the DC power supply 20p is applied to the electrode of the first electrostatic chuck 21, attractive electrostatic force occurs between the first electrostatic chuck 21 and the substrate W. Due to the attractive electrostatic force, the substrate W is held to the first electrostatic chuck 21.

An edge ring (annular member) 25 is disposed at a periphery of the lower electrode 18 so as to surround an edge of the substrate W. The edge ring 25 improves in-plane uniformity of plasma processing with respect to the substrate W. The edge ring 25 may be formed of silicon, silicon carbide, quartz, or the like.

A second electrostatic chuck 22 is disposed at the periphery of the lower electrode 18. The second electrostatic chuck 22 is disposed concentrically with the first electrostatic chuck 21, and the second electrostatic chuck 22 is disposed outside the first electrostatic chuck 21. The edge ring 25 is disposed on an upper surface of the second electrostatic chuck 22. The second electrostatic chuck 22 includes a body and an electrode. The body of the second electrostatic chuck 22 is formed in a substantially annular shape, and is made from a dielectric material. The electrode of the second electrostatic chuck 22 is a film-like electrode embedded in the body of the second electrostatic chuck 22. The electrode of the second electrostatic chuck 22 is connected to the DC power supply 20p via the switch 20s. When voltage from the DC power supply 20p is applied to the electrodes of the second electrostatic chuck 22, an attractive electrostatic force occurs between the second electrostatic chuck 22 and the edge ring 25. Because of the attractive electrostatic force, the edge ring 25 is held to the second electrostatic chuck 22. The switch 20s and the DC power supply 20p may be provided separately for the first and second electrostatic chucks 21 and 22.

A flow passage 18f is provided within the lower electrode 18. A heat exchange medium (e.g., refrigerant) is supplied to the flow passage 18f from a chiller unit (not illustrated) provided outside the chamber 10 through a tube 28a. The heat exchange medium supplied to the flow passage 18f is returned to the chiller unit via a tube 28b. In the substrate processing apparatus 1, a temperature of the substrate W placed on the first electrostatic chuck 21 is adjusted by heat exchange between the heat exchange medium and the lower electrode 18.

The substrate processing apparatus 1 is provided with a gas supply line (heat transmitting gas supply line) 29. The gas supply line 29 supplies a heat transmitting gas (e.g., He gas) from a heat transmitting gas supply mechanism between the upper surface of the first electrostatic chuck 21 and the bottom surface of the substrate W. The gas supply line 29 also supplies heat transmitting gas (e.g., He gas) from the heat transmitting gas supply mechanism to a gap between the upper surface of the second electrostatic chuck 22 and the bottom surface of the edge ring 25.

The substrate processing apparatus 1 further includes an upper electrode 30. The upper electrode 30 is provided above the stage 14. The upper electrode 30 is supported on top of the chamber body 12 via a member 32. The member 32 is formed of an insulating material. The upper electrode 30 and the member 32 occlude an opening of the chamber body 12 at an upper portion.

The upper electrode 30 may include a top plate 34 and a support 36. The bottom surface of the top plate 34 faces the interior space 10s, and defines the interior space 10s. The top plate 34 may be formed of a low resistance conductor or semiconductor with low Joule heat generation. The top plate 34 includes multiple gas discharge holes 34a that penetrate the top plate 34 in a thickness direction of the top plate 34.

The support 36 removably supports the top plate 34. The support 36 is formed of an electrically conductive material such as aluminum. Inside the support 36, a gas diffusion chamber 36a is formed. The support 36 includes multiple gas holes 36b extending downwardly from the gas diffusion chamber 36a. Each of the gas holes 36b communicates with a corresponding gas discharge hole among the gas discharge holes 34a. A gas inlet 36c is formed in the support 36. The gas inlet 36c is connected to the gas diffusion chamber 36a. A gas supply line 38 is connected to the gas inlet 36c.

Valves 42, flow controllers 44, and gas sources 40 are connected to the gas supply line 38. The gas sources 40, the valves 42, and the flow controllers 44 constitute a gas supply section. The gas sources 40 include multiple gas sources. The valves 42 include multiple on-off valves. The flow controllers 44 include multiple flow controllers. Each of the flow controllers of the flow controllers 44 is a mass flow controller or a pressure controlled flow controller. Each of the gas sources of the gas sources 40 is connected to the gas supply line 38 via a corresponding on-off valve of the valves 42 and a corresponding flow controller of the flow controllers 44.

In the substrate processing apparatus 1, a shield 46 is removably attached along the inner wall surface of the chamber body 12 and along an outer periphery of the support section 13. The shield 46 prevents reaction by-products from adhering to the chamber body 12. The shield 46 is, for example, configured by forming a corrosion resistant film on a surface of a base metal formed of aluminum. The corrosion resistant film may be formed of ceramic such as yttrium oxide.

A baffle plate 48 is provided between side walls of the support section 13 and the chamber body 12. The baffle plate 48 is, for example, configured by forming a corrosion resistant film (a film such as yttrium oxide) on a surface of a base metal formed of aluminum. Multiple through-holes are formed in the baffle plate 48. Below the baffle plate 48, that is, at the bottom of the chamber body 12, an exhaust port 12e is provided. An exhaust device 50 is connected to the exhaust port 12e through an exhaust pipe 52. The exhaust device 50 includes a pressure regulating valve, and a vacuum pump such as a turbomolecular pump.

The substrate processing apparatus 1 includes a first radio frequency power supply 62 and a second radio frequency power supply 64. The first radio frequency power supply 62 is a power source that generates radio frequency electric power of a first type (may also be referred to as "first radio frequency power"). The first radio frequency power has a frequency suitable for generating a plasma. The frequency of the first radio frequency power is, for example, in a range between 27 MHz and 100 MHz. The first radio frequency power supply 62 is connected to the lower electrode 18 via a matching device 66 and the electrode plate 16. The matching device 66 includes circuitry for causing output impedance of the first radio frequency power supply 62 to match impedance of loads (lower electrode 18 and the like). The first radio frequency power supply 62 may be connected to the upper electrode 30 via the matching device 66. The first radio frequency power supply 62 configures an example of a plasma generator.

The second radio frequency power supply 64 is a power source that generates radio frequency electric power of a second type (may also be referred to as "second radio frequency power"). The second radio frequency power has a frequency lower than the frequency of the first radio frequency power. In a case in which the second radio frequency power is used in conjunction with the first radio frequency power, the second radio frequency power is used as radio frequency electric power for generating bias voltage in order to attract ions into the substrate W. The frequency of the second radio frequency power is, for example, in a range between 400 kHz and 13.56 MHz. The second radio frequency power supply 64 is connected to the lower electrode 18 via a matching device 68 and the electrode plate 16. The matching device 68 includes circuitry for causing output impedance of second radio frequency power supply 64 to match the impedance of loads (lower electrode 18 and the like).

It should be noted that a plasma may be generated using the second radio frequency power without using a first radio frequency power. That is, a plasma may be generated by using only a single type of radio frequency power. In such a case, a frequency of the second radio frequency power may be greater than 13.56 MHz, for example 40 MHz. The substrate processing apparatus 1 may not include the first radio frequency power supply 62 and the matching device 66. The second radio frequency power supply 64 constitutes an example of a plasma generator.

In the substrate processing apparatus 1, gas is supplied from the gas supply section to the interior space 10s to generate a plasma. Also, as the first radio frequency power and/or the second radio frequency power are supplied, a radio frequency electric field is generated between the upper electrode 30 and the lower electrode 18. The generated radio frequency electric field generates the plasma.

The substrate processing apparatus 1 includes a power supply 70. The power supply 70 is connected to the upper electrode 30. The power supply 70 applies voltage to the upper electrode 30 to attract positive ions present in the interior space 10s into the top plate 34.

The substrate processing apparatus 1 may further includes a controller 80. The controller 80 may be a computer including a processor, a storage unit such as a memory, an input device, a display device, an input/output interface of a signal, and the like. The controller 80 controls each component of the substrate processing apparatus 1. In the controller 80, an operator can perform operations such as a command input operation using the input device, to manage the substrate processing apparatus 1. The controller 80 can also display an operating status of the substrate processing apparatus 1 on the display device. Further, a control program and recipe data are stored in the storage unit. The control program is executed by the processor for executing various processes in the substrate processing apparatus 1. The processor executes the control program to control each of the components of the substrate processing apparatus 1 in accordance with the recipe data.

Figure 2:
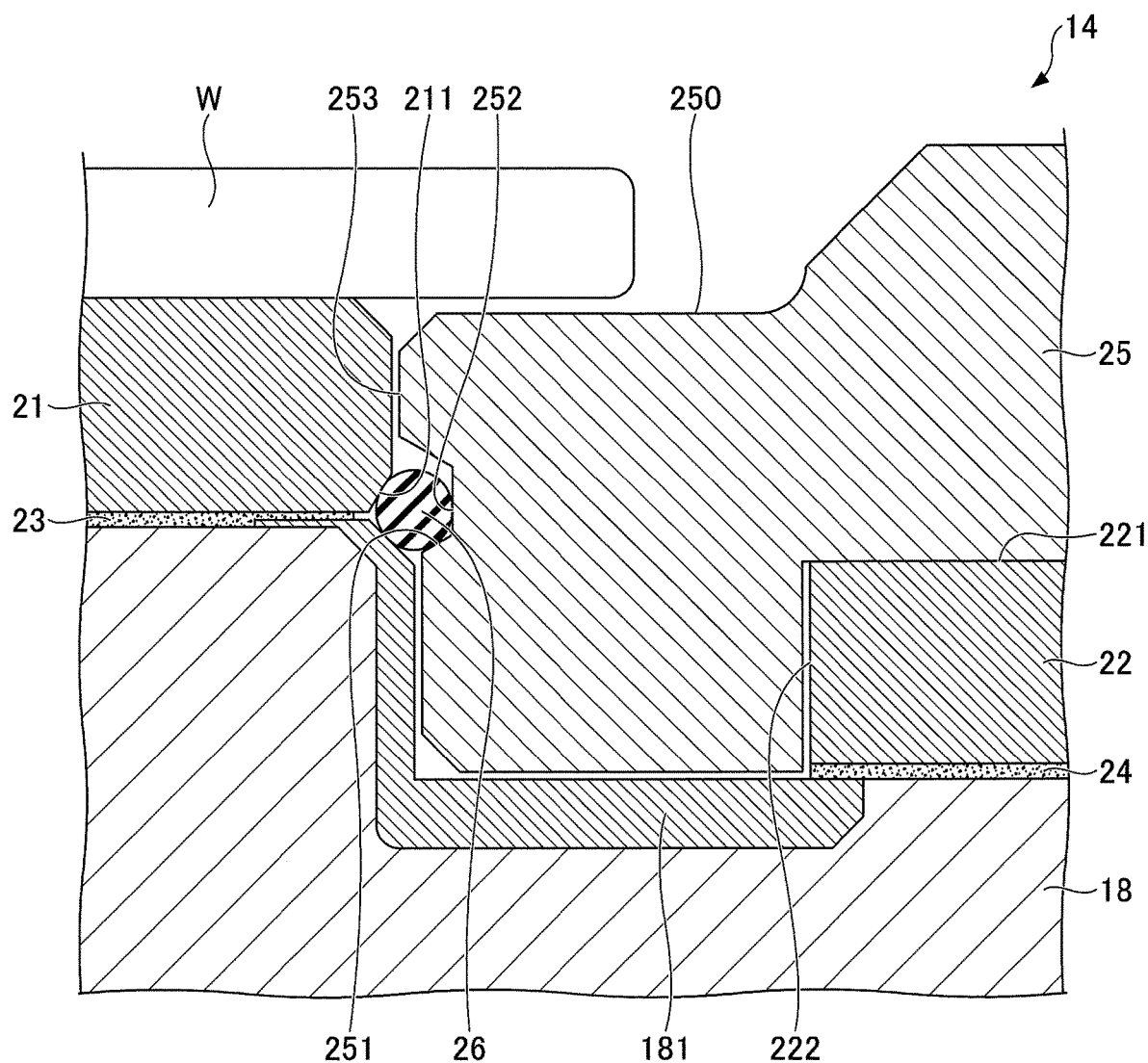
FIG. 2 is a partially enlarged sectional view illustrating an example of a stage of the substrate processing apparatus according to the first embodiment.

Next, a stage 14 of the substrate processing apparatus 1 according to the first embodiment will be further described with reference to FIG. 2. FIG. 2 is an enlarged sectional view illustrating an example of the stage 14 of the substrate processing apparatus 1 according to the first embodiment.

As illustrated in FIG. 2, a plate thickness of the first electrostatic chuck 21 is approximately equal to that of the second electrostatic chuck 22. The first electrostatic chuck 21 is bonded to the lower electrode 18 with a first bonding layer 23. The second electrostatic chuck 22 is bonded, with a second bonding layer 24, to a periphery of the lower electrode 18. The first bonding layer 23 and the second bonding layer 24 may be, for example, an adhesive made from silicone, epoxy, or the like.

Also, on the upper surface of the lower electrode 18, an insulating film 181 is formed in the region between the first and second electrostatic chucks 21 and 22. Examples of the insulating film 181 include a thermal sprayed film formed by $Al_2O_3$, $Y_2O_3$, or the like, so that the surface of the lower electrode 18 is not exposed to the interior space 10s of the chamber 10. Note that the insulating film 181 may not be formed.

A step is formed on an upper surface of the edge ring 25, and a part of a lower level surface (250 in FIG. 2) of the upper surface of the edge ring 25 faces a bottom surface of the substrate W near an outer edge of the substrate W. In the following description, the lower level surface 250 of the upper surface of the edge ring 25 is referred to as a "stepped surface 250". The stepped surface 250 of the edge ring 25 is positioned slightly below the upper surface of the first electrostatic chuck 21. Therefore, when the substrate W is placed on the first electrostatic chuck 21, a slight gap is formed between the bottom surface of the substrate W and the stepped surface 250 of the edge ring 25.

Also, the edge ring 25 is formed to cover the second electrostatic chuck 22 from an inside of the second electrostatic chuck 22 when the edge ring 25 is placed on the second electrostatic chuck 22. That is, the edge ring 25 is formed to cover an upper surface 221 and an inner side surface 222 of the second electrostatic chuck 22. Thus, a thickness of a portion of the edge ring 25 positioned below the outer periphery of the substrate W can be increased. For example, the thickness of the portion of the edge ring 25 positioned below the outer periphery of the substrate W can be made to be greater than a height of an upper surface of the first electrostatic chuck 21 from an upper surface of the second electrostatic chuck 22.

Here, a sealing member 26 is provided to seal a path originating from a space in the interior space 10s above the stage 14 to the first bonding layer 23, through a gap between the first electrostatic chuck 21 and the edge ring 25, and to seal a path originating from the space in the interior space 10s above the stage 14 to the second bonding layer 24, through the gap between the first electrostatic chuck 21 and the edge ring 25. The sealing member 26 is of an annular shape, for example, and seals the paths so that radicals generated in the space above the stage 14 do not reach the first bonding layer 23 and the second bonding layer 24. The sealing member 26 may be an elastic member having resistance to radicals, such as perfluoroelastomer.

An edge between a bottom surface and a side surface of the first electrostatic chuck 21 is chamfered, to form a tapered surface 211. The tapered surface 211 has a normal vector whose vertical component is in a downward direction and whose horizontal component is in an outward direction (right direction FIG. 2). On the edge ring 25, a tapered surface 251 is formed. The tapered surface 251 a normal vector whose vertical component is in an upward direction and whose horizontal component is in an inward direction (left direction FIG. 2). An inner side surface 252 is formed on the edge ring 25.

The sealing member 26 abuts the tapered surface 211 of the first electrostatic chuck 21 to seal the path to the first bonding layer 23. The sealing member 26 also abuts the tapered surface 251 and the inner side surface 252 of the edge ring 25 to seal the path to the second bonding layer 24. The sealing member 26 may come into contact with the lower electrode 18 (or insulating film 181).

A projecting portion 253 is formed on the edge ring 25 above the sealing member 26. The projecting portion 253 narrows the gap between the first electrostatic chuck 21 and the edge ring 25.

As described above, according to the substrate processing apparatus 1 of the first embodiment, the sealing member 26 can prevent radicals generated in a space between the lower electrode 18 and the upper electrode 30 from reaching the first bonding layer 23 and the second bonding layer 24, as illustrated in FIG. 2. This prevents the first bonding layer 23 and the second bonding layer 24 from deteriorating due to radicals. Therefore, it is possible to prevent the first and second electrostatic chucks 21 and 22 from peeling away from the lower electrode 18.

Also, as illustrated in FIG. 1, heat transmitting gas is supplied between the upper surface 221 of the second electrostatic chuck 22 and the bottom surface of the edge ring 25. If heat transmitting gas blows onto the bottom surface of the edge ring 25, particles are generated. As illustrated in FIG. 2, the edge ring 25 is configured to cover the second electrostatic chuck 22 from the inside. Also, the sealing member 26 abuts the first electrostatic chuck 21 and the edge ring 25, and seals the gap between the first electrostatic chuck 21 and the edge ring 25. This prevents heat transmitting gas supplied to the bottom surface of the edge ring 25 from leaking toward the substrate W, and allows the heat transmitting gas to flow outward in a radial direction of the edge ring 25. Accordingly, it is possible to prevent particles generated on the bottom surface of the edge ring 25 or the like from flowing, with the heat transmitting gas, toward the substrate W. The heat transmitting gas and the particles that are discharged outward in the radial direction are evacuated out of the chamber 10 through a space between the support section 13 and the side wall of the chamber body 12, the baffle plate 48, and the exhaust pipe 52.

Further, because the edge ring 25 is formed to cover the second electrostatic chuck 22 from the inside, a thickness of the edge ring 25 positioned below the outer periphery of the substrate W can be increased. Here, during plasma processing, the stepped surface 250 of the edge ring 25 abrades. By thickening the edge ring 25 at the stepped surface 250, a life of the edge ring 25 can be prolonged, and a maintenance cost can be reduced.

The sealing member 26 abuts the tapered surface 211 of the first electrostatic chuck 21 and the tapered surface 251 of the edge ring 25. Therefore, restoring force of the sealing member 26, which is an elastic body, exerts force on the edge ring 25 outwardly in a radial direction of the edge ring 25 and downwardly in a vertical direction (a direction toward the lower electrode) that is perpendicular to the radial direction. Thus, the edge ring 25 is prevented from being lifted from the second electrostatic chuck 22. Also, contacting performance between the edge ring 25 and the second electrostatic chuck 22 can be improved, and heat conductivity between the lower electrode 18 and the edge ring 25 can be improved.

The sealing member 26 also abuts the inner side surface 252 of the edge ring 25. Therefore, alignment of the central axis of the first electrostatic chuck 21 with the central axis of the edge ring 25 is adjusted by the elastic force of the sealing member 26. This facilitates centering of the edge ring 25.

The edge ring 25 also includes the projecting portion 253. This reduces the gap between the first electrostatic chuck 21 and the edge ring 25, and can prevent radicals from entering the paths to the first and second bonding layers 23 and 24. Also, the projecting portion 253 can prevent the sealing member 26 from coming off between the first electrostatic chuck 21 and the edge ring 25.

In addition, a thickness of the first bonding layer 23 at an outer peripheral portion may be thinner than a thickness of the first bonding layer 23 at an inner peripheral portion. Accordingly, thermal conductivity between the first electrostatic chuck 21 and the lower electrode 18 can be improved at the outer periphery of the first electrostatic chuck 21, as compared to thermal conductivity at the inner periphery of the first electrostatic chuck 21. As illustrated in FIG. 2, an outer peripheral portion of the substrate W mounted on the first electrostatic chuck 21 is not in contact with the first electrostatic chuck 21. By improving the thermal conductivity at the outer periphery of the first electrostatic chuck 21, uniformity in temperature of the substrate W can be improved.

Second Embodiment

Figure 3:
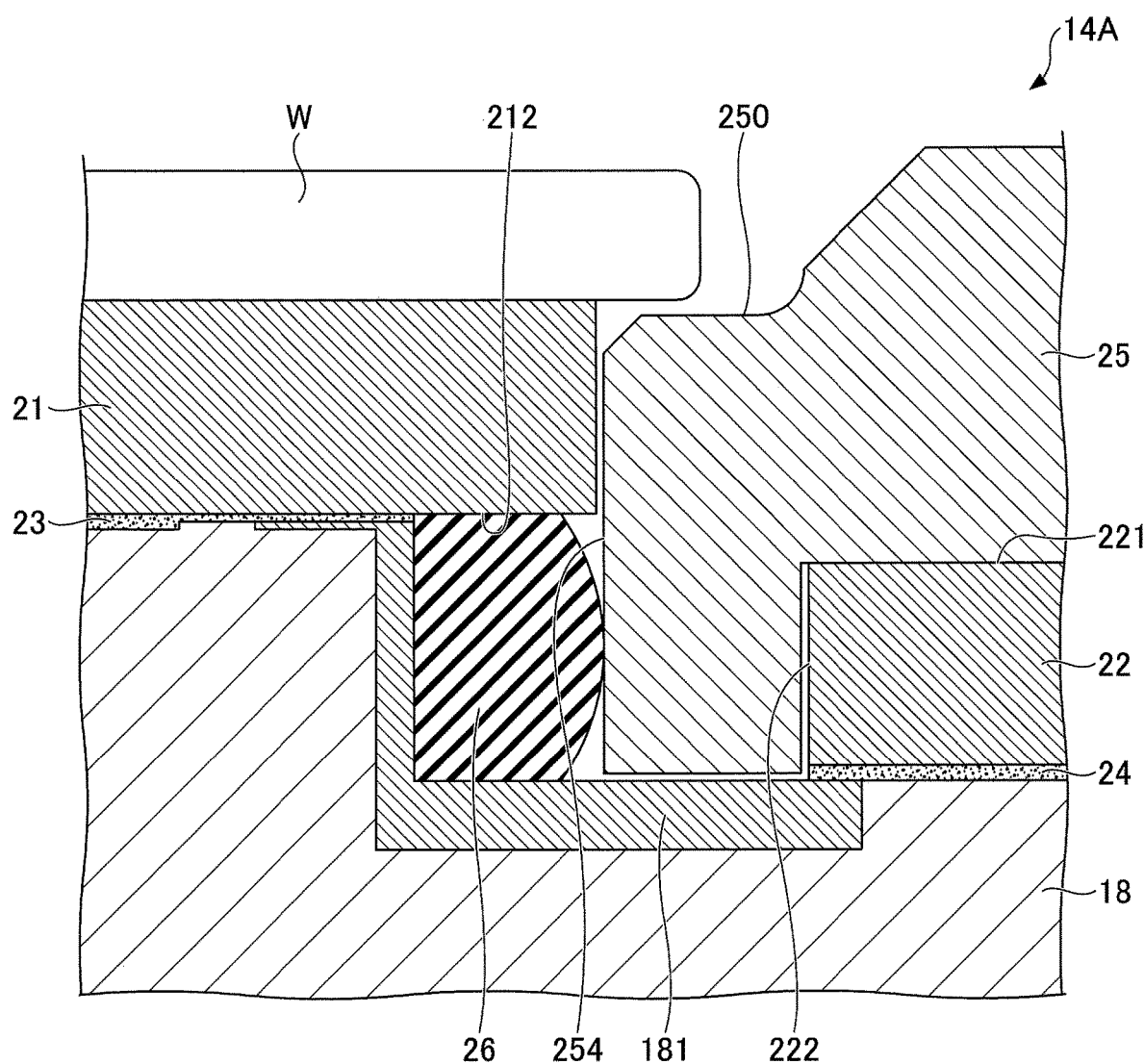
FIG. 3 is a partially enlarged sectional view illustrating an example of a stage of the substrate processing apparatus according to a second embodiment.

Next, a substrate processing apparatus according to a second embodiment will be described with reference to FIG. 3. FIG. 3 is an enlarged sectional view illustrating an example of a stage 14A of the substrate processing apparatus according to the second embodiment. The substrate processing apparatus according to the second embodiment and the substrate processing apparatus 1 according to the first embodiment (see FIG. 1) differ in a structure of the stage 14A. As the other configurations are the same, overlapping descriptions are omitted.

As illustrated in FIG. 3, a plate thickness of the first electrostatic chuck 21 is approximately equal to that of the second electrostatic chuck 22. The first electrostatic chuck 21 is bonded to the lower electrode 18 with the first bonding layer 23. The second electrostatic chuck 22 is bonded with the second bonding layer 24 to a periphery of the lower electrode 18. Also, an insulating film 181 is formed on the upper surface of the lower electrode 18 in a region between the first and second electrostatic chucks 21 and 22. The insulating film 181 may not be formed.

The edge ring 25 has a stepped surface 250 configured to face a bottom surface of the substrate W near an outer edge of the substrate W. The stepped surface 250 of the edge ring 25 is positioned slightly below the upper surface of the first electrostatic chuck 21. Therefore, when the substrate W is placed on the first electrostatic chuck 21, a slight gap is formed between the bottom surface of the substrate W and the stepped surface 250 of the edge ring 25.

When the edge ring 25 is placed on the second electrostatic chuck 22, the edge ring 25 is formed to cover the second electrostatic chuck 22 from an inside of the second electrostatic chuck 22. That is, the edge ring 25 is formed to cover an upper surface 221 and an inner side surface 222 of the second electrostatic chuck 22. Thus, a thickness of a portion of the edge ring 25 positioned below the outer periphery of the substrate W can be increased. For example, the thickness of the portion of the edge ring 25 positioned below the outer periphery of the substrate W can be made to be greater than a height of an upper surface of the first electrostatic chuck 21 from an upper surface of the second electrostatic chuck 22.

Here, a sealing member 26 is provided to seal a path originating from a space in the interior space 10s above the stage 14A to the first bonding layer 23 through a gap between the first electrostatic chuck 21 and the edge ring 25, and to seal a path originating from the space in the interior space 10s above the stage 14A to the second bonding layer 24 through the gap between the first electrostatic chuck 21 and the edge ring 25. The sealing member 26 seals the paths so that radicals generated in the space above the stage 14A do not reach the first bonding layer 23 and the second bonding layer 24.

At an outer edge of the bottom surface of the first electrostatic chuck 21, an abutting portion 212 that abuts the sealing member 26 is provided. Further, an inner side surface 254 is formed on the edge ring 25.

The sealing member 26 abuts the abutting portion 212 of the first electrostatic chuck 21 to seal the path to the first bonding layer 23. The sealing member 26 also abuts the inner side surface 254 of the edge ring 25 to seal the path to the second bonding layer 24. The sealing member 26 may come into contact with the lower electrode 18 (or insulating film 181).

As described above, according to the substrate processing apparatus in the second embodiment, as illustrated in FIG. 3, the sealing member 26 can prevent radicals generated in a space between the lower electrode 18 and the upper electrode 30 from reaching the first bonding layer 23 and the second bonding layer 24. This prevents the first bonding layer 23 and the second bonding layer 24 from deteriorating due to radicals. Therefore, it is possible to prevent the first and second electrostatic chucks 21 and 22 from peeling away from the lower electrode 18.

Also, as illustrated in FIG. 3, the edge ring 25 is formed to cover the second electrostatic chuck 22 from the inside. Also, the sealing member 26 abuts the first electrostatic chuck 21 and the edge ring 25, and seals the gap between the first electrostatic chuck 21 and the edge ring 25. This prevents heat transmitting gas supplied to the bottom surface of the edge ring 25 from leaking toward the substrate W, and allows the heat transmitting gas to flow outward in a radial direction of the edge ring 25. Accordingly, it is possible to prevent particles generated on the bottom surface of the edge ring 25 or the like from flowing, with the heat transmitting gas, toward the substrate W.

Further, because the edge ring 25 is formed to cover the second electrostatic chuck 22 from the inside, a thickness of the edge ring 25 positioned below the outer periphery of the substrate W can be increased. Here, during plasma processing, the stepped surface 250 of the edge ring 25 abrades. By thickening the edge ring 25 at the stepped surface 250 of, a life of the edge ring 25 can be prolonged, and a maintenance cost can be reduced.

The sealing member 26 abuts the abutting portion 212 of the first electrostatic chuck 21 and the inner side surface 254 of the edge ring 25. Therefore, restoring force of the sealing member 26, which is made of an elastic material, exerts force on the edge ring 25 outwardly in a radial direction of the edge ring 25. Thus, the edge ring 25 is prevented from being lifted from the second electrostatic chuck 22.

The sealing member 26 also abuts the inner side surface 254 of the edge ring 25. Therefore, alignment of the central axis of the first electrostatic chuck 21 with the central axis of the edge ring 25 is adjusted by the elastic force of the sealing member 26. This facilitates centering of the edge ring 25.

In addition, a thickness of the first bonding layer 23 at an outer peripheral portion may be thinner than a thickness of the first bonding layer 23 at an inner peripheral portion. Accordingly, thermal conductivity between the first electrostatic chuck 21 and the lower electrode 18 can be improved at the outer periphery of the first electrostatic chuck 21, as compared to thermal conductivity at the inner periphery of the first electrostatic chuck 21. As illustrated in FIG. 3, an outer peripheral portion of the substrate W mounted on the first electrostatic chuck 21 is not in contact with the first electrostatic chuck 21. By improving the thermal conductivity at the outer periphery of the first electrostatic chuck 21, uniformity in temperature of the substrate W can be improved.

Third Embodiment

Figure 4:
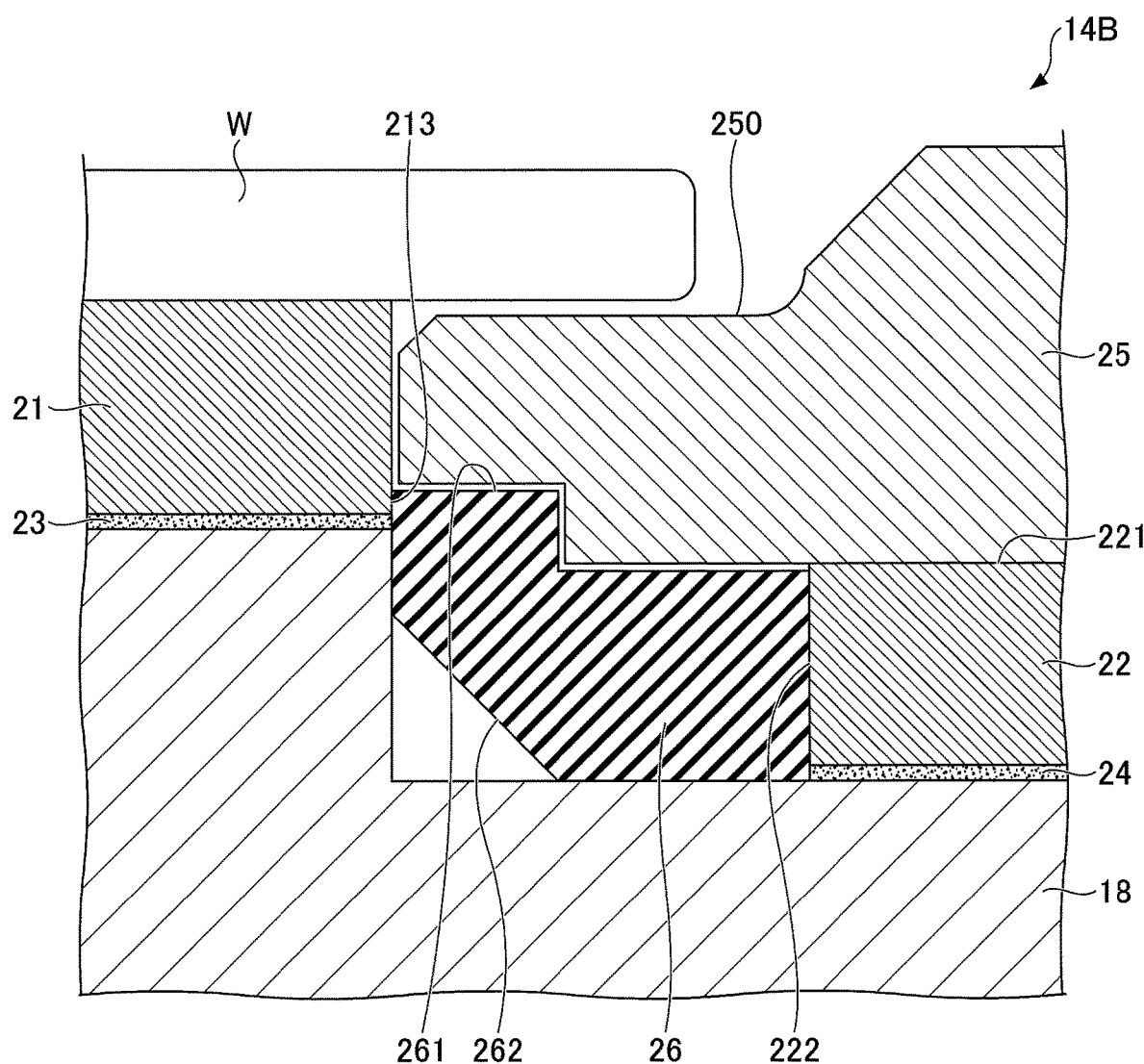
FIG. 4 is a partially enlarged sectional view illustrating an example of a stage of the substrate processing apparatus according to a third embodiment.

Next, a substrate processing apparatus according to a third embodiment will be described with reference to FIG. 4. FIG. 4 is an enlarged sectional view illustrating an example of a stage 14B of the substrate processing apparatus according to the third embodiment. The substrate processing apparatus according to the third embodiment and the substrate processing apparatus 1 according to the first embodiment (see FIG. 1) differ in a structure of the stage 14B. As the other configurations are the same, overlapping descriptions are omitted.

As illustrated in FIG. 4, a plate thickness of the first electrostatic chuck 21 is approximately equal to that of the second electrostatic chuck 22. The first electrostatic chuck 21 is bonded to the lower electrode 18 with the first bonding layer 23. The second electrostatic chuck 22 is bonded with the second bonding layer 24 to a periphery of the lower electrode 18. An insulating film may be formed on an upper surface of the lower electrode 18 in a region between the first electrostatic chuck 21 and the second electrostatic chuck 22.

The edge ring 25 has a stepped surface 250 configured to face a bottom surface of the substrate W near an outer edge of the bottom surface of the substrate W. The stepped surface 250 of the edge ring 25 is positioned slightly below the upper surface of the first electrostatic chuck 21. Therefore, when the substrate W is placed on the first electrostatic chuck 21, a slight gap is formed between the bottom surface of the substrate W and the stepped surface 250 of the edge ring 25.

When the edge ring 25 is placed on the second electrostatic chuck 22, the edge ring 25 is formed to cover an upper surface 221 of the second electrostatic chuck 22.

Here, a sealing member 26 is provided to seal a path originating from a space above the stage 14B in the interior space 10s to the first bonding layer 23 through a gap between the first electrostatic chuck 21 and the edge ring 25, and to seal a path originating from the space above the stage 14B in the interior space 10s to the second bonding layer 24 through the gap between the first electrostatic chuck 21 and the edge ring 25. The sealing member 26 seals the paths so that radicals generated in the space above the stage 14B do not reach the first bonding layer 23 and the second bonding layer 24.

An abutting portion 213 that abuts the sealing member 26 is provided on a side surface of the first electrostatic chuck 21. Further, an inner side surface 222 is formed on the second electrostatic chuck 22.

The upper surface 261 of the sealing member 26 is formed to be higher than the bottom surface of the first electrostatic chuck 21, at a side closer to the first electrostatic chuck 21 (inner side in a radial direction of the sealing member 26 or the first electrostatic chuck 21). Accordingly, the sealing member 26 abuts the abutting portion 213 of the first electrostatic chuck 21, to seal the path to the first bonding layer 23. At a side closer to the second electrostatic chuck 22 (outer side in the radial direction), the sealing member 26 abuts the inner side surface 222 of the second electrostatic chuck 22 to seal the path to the second bonding layer 24. The sealing member 26 may come into contact with the lower electrode 18.

When the edge ring 25 is placed on the second electrostatic chuck 22, a slight gap is formed between the bottom surface of the edge ring and the upper surface of the sealing member 26. The sealing member 26 also has a chamfer 262 formed at an edge of the bottom surface of the sealing member 26 positioned at an inner side in a radial direction of the sealing member 26 (or some other components such as the edge ring 25 or the second electrostatic chuck 22).

As described above, according to the substrate processing apparatus in the third embodiment, as illustrated in FIG. 4, the sealing member 26 can prevent radicals generated in a space between the lower electrode 18 and the upper electrode 30 from reaching the first bonding layer 23 and the second bonding layer 24. This prevents the first bonding layer 23 and the second bonding layer 24 from deteriorating due to radicals. Therefore, it is possible to prevent the first and second electrostatic chucks 21 and 22 from peeling away from the lower electrode 18.

The gap between the bottom surface of the edge ring 25 and the upper surface of the sealing member 26 can prevent the sealing member 26 from applying force to the edge ring 25 to lift the edge ring 25 from the second electrostatic chuck 22.

In addition, as the chamfer 262 is formed on the sealing member 26, in a case in which volume of the sealing member 26 increases due to its thermal expansion, the increased volume of the sealing member 26 can expand toward the chamfer 262. Thus, the sealing member 26 is prevented from applying force to the edge ring 25 to lift the edge ring 25 from the second electrostatic chuck 22 due to the thermal expansion of the sealing member 26.

Fourth Embodiment

Figure 5:
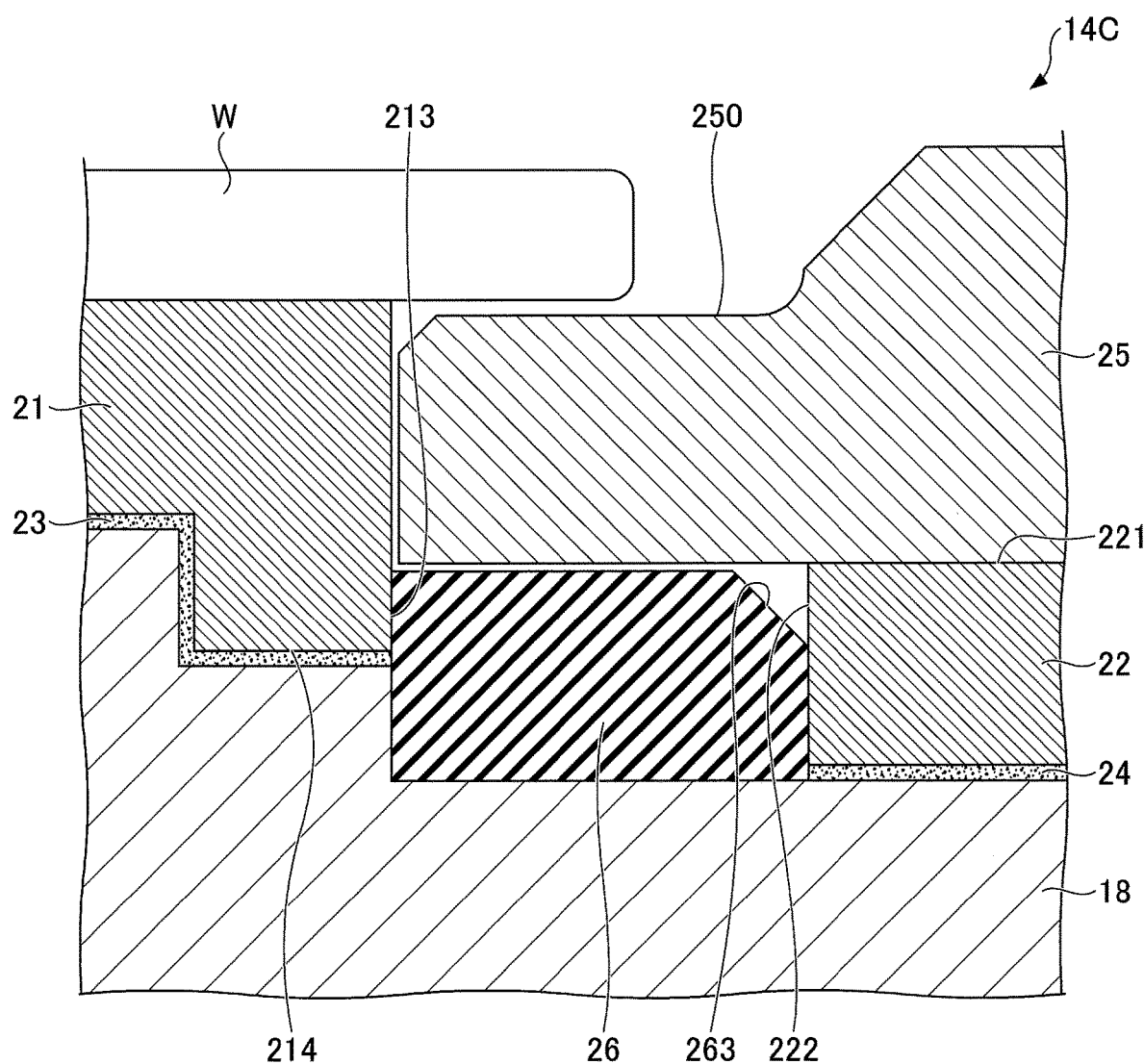
FIG. 5 is a partially enlarged sectional view illustrating an example of a stage of the substrate processing apparatus according to a fourth embodiment.

Next, a substrate processing apparatus according to a fourth embodiment will be described with reference to FIG. 5. FIG. 5 is an enlarged sectional view illustrating an example of a stage 14C of the substrate processing apparatus according to the fourth embodiment. The substrate processing apparatus according to the fourth embodiment and the substrate processing apparatus 1 according to the first embodiment (see FIG. 1) differ in a structure of the stage 14C. As the other configurations are the same, overlapping descriptions are omitted.

As illustrated in FIG. 5, a thickness of the first electrostatic chuck 21 near a center of the first electrostatic chuck 21 is substantially equal to a thickness of the second electrostatic chuck 22. In addition, the first electrostatic chuck 21 is thickened at an outer periphery of the first electrostatic chuck 21. The first electrostatic chuck 21 is bonded to the lower electrode 18 with the first bonding layer 23. The second electrostatic chuck 22 is bonded with the second bonding layer 24 to a periphery of the lower electrode 18. An insulating film may be formed on an upper surface of the lower electrode 18 in a region between the first electrostatic chuck 21 and the second electrostatic chuck 22.

The edge ring 25 has a stepped surface 250 configured to face a bottom surface of the substrate W near an outer edge of the substrate W. The stepped surface 250 of the edge ring 25 is positioned slightly below the upper surface of the first electrostatic chuck 21. Therefore, when the substrate W is placed on the first electrostatic chuck 21, a slight gap is formed between the bottom surface of the substrate W and the stepped surface 250 of the edge ring 25.

Also, the edge ring 25 is formed to cover the upper surface 221 of the second electrostatic chuck 22 when the edge ring 25 is placed on the second electrostatic chuck 22.

Here, a sealing member 26 is provided to seal a path originating from a space above the stage 14C of the interior space 10s to the first bonding layer 23 through a gap between the first electrostatic chuck 21 and the edge ring 25, and to seal a path originating from the space above the stage 14C of the interior space 10s to the second bonding layer 24 through the gap between the first electrostatic chuck 21 and the edge ring 25. The sealing member 26 seals the paths so that radicals generated in the space above the stage 14C do not reach the first bonding layer 23 and the second bonding layer 24.

An abutting portion 213 that abuts the sealing member 26 is formed on a side surface of the first electrostatic chuck 21. Further, an inner side surface 222 is formed on the second electrostatic chuck 22.

With respect to the outer periphery of the first electrostatic chuck 21, which is formed to be thicker than other portions, a bottom surface 214 of the outer periphery of the first electrostatic chuck 21 is formed to be lower than the upper surface 221 of the second electrostatic chuck 22. Accordingly, the sealing member 26 abuts the abutting portion 213 of the first electrostatic chuck 21, to seal the path to the first bonding layer 23. The sealing member 26 also abuts the inner side surface 222 of the second electrostatic chuck 22 to seal the path to the second bonding layer 24. The sealing member 26 may come into contact with the lower electrode 18.

When the edge ring 25 is placed on the second electrostatic chuck 22, a slight gap is formed between the bottom surface of the edge ring 25 and an upper surface of the sealing member 26. The sealing member 26 also has a chamfer 263 formed at an edge of the upper surface of the sealing member 26 positioned at an outer side in a radial direction of the edge ring 25 or the second electrostatic chuck 22.

As described above, according to the substrate processing apparatus in the fourth embodiment, as illustrated in FIG. 5, the sealing member 26 can prevent radicals generated in the space between the lower electrode 18 and the upper electrode 30 from reaching the first bonding layer 23 and the second bonding layer 24. This prevents the first bonding layer 23 and the second bonding layer 24 from deteriorating due to radicals. Therefore, it is possible to prevent the first and second electrostatic chucks 21 and 22 from peeling away from the lower electrode 18.

The gap between the bottom surface of the edge ring 25 and the upper surface of the sealing member 26 can prevent the sealing member 26 from applying force to the edge ring 25 to lift the edge ring 25 from the second electrostatic chuck 22.

In addition, as the chamfer 263 is formed on the sealing member 26, in a case in which volume of the sealing member 26 increases due to its thermal expansion, the increased volume of the sealing member 26 can expand toward the chamfer 263. Thus, the sealing member 26 is prevented from applying force to the edge ring 25 to lift the edge ring 25 from the second electrostatic chuck 22 due to the thermal expansion of the sealing member 26.

In addition, in the substrate processing apparatus according to the fourth embodiment, the shape of the sealing member 26 can be simplified compared to the substrate processing apparatus according to the third embodiment.

Fifth Embodiment

Figure 6:
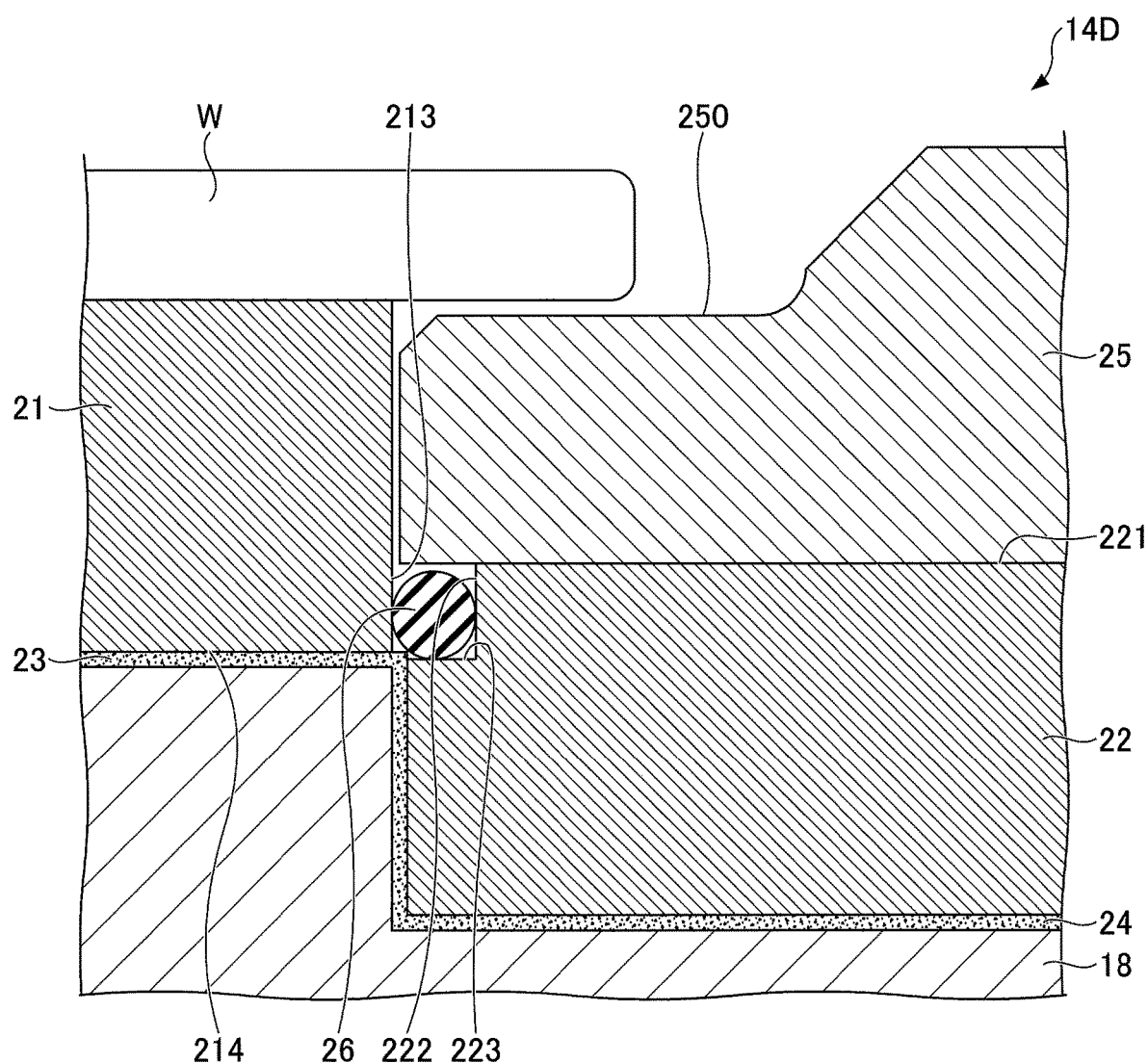
FIG. 6 is a partially enlarged sectional view illustrating an example of a stage of the substrate processing apparatus according to a fifth embodiment.

Next, a substrate processing apparatus according to a fifth embodiment will be described with reference to FIG. 6. FIG. 6 is an enlarged sectional view illustrating an example of a stage 14D of the substrate processing apparatus according to the fifth embodiment. The substrate processing apparatus according to the fifth embodiment and the substrate processing apparatus 1 according to the first embodiment (see FIG. 1) differ in a structure of the stage 14D. As the other configurations are the same, overlapping descriptions are omitted.

As illustrated in FIG. 6, a plate thickness of the first electrostatic chuck 21 is approximately equal to that of the second electrostatic chuck 22. In addition, each of the first electrostatic chuck 21 and the second electrostatic chuck 22 is formed to be thick so that an upper surface 221 of the second electrostatic chuck 22 is positioned higher than the bottom surface of the first electrostatic chuck 21. The first electrostatic chuck 21 is bonded to the lower electrode 18 with the first bonding layer 23. The second electrostatic chuck 22 is bonded with the second bonding layer 24 to a periphery of the lower electrode 18. On an upper surface or a side surface of the lower electrode 18, an insulating film may be formed between the first electrostatic chuck 21 and the second electrostatic chuck 22.

The edge ring 25 has a stepped surface 250 configured to face a bottom surface of the substrate W near an outer edge of the substrate W. The stepped surface 250 of the edge ring 25 is positioned slightly below the upper surface of the first electrostatic chuck 21. Therefore, when the substrate W is placed on the first electrostatic chuck 21, a slight gap is formed between the bottom surface of the substrate W and the stepped surface 250 of the edge ring 25.

Also, the edge ring 25 is formed to cover the upper surface 221 of the second electrostatic chuck 22 when the edge ring 25 is placed on the second electrostatic chuck 22.

Here, a sealing member 26 is provided to seal a path originating from a space above the stage 14D of the interior space 10s to the first bonding layer 23 through a gap between the first electrostatic chuck 21 and the edge ring 25, and to seal a path originating from the space above the stage 14D of the interior space 10s to the second bonding layers 24 through the gap between the first electrostatic chuck 21 and the edge ring 25. The sealing member 26 seals the paths so that radicals generated in the space above the stage 14D do not reach the first bonding layer 23 and the second bonding layer 24.

An abutting portion 213 that abuts the sealing member 26 is formed on a side surface of the first electrostatic chuck 21. Further, an inner side surface 222 is formed on the second electrostatic chuck 22.

The sealing member 26 abuts the abutting portion 213 of the first electrostatic chuck 21 to seal the path to the first bonding layer 23. The sealing member 26 also abuts the inner side surface 222 of the second electrostatic chuck 22 to seal the passage to the second bonding layer 24. The sealing member 26 may come into contact with the lower electrode 18 (or the bonding layer 23 or 24 formed on the lower electrode 18). The sealing member 26 may also come into contact with a stepped surface 223 of the second electrostatic chuck 22.

When the edge ring 25 is placed on the second electrostatic chuck 22, a slight gap is formed between the bottom surface of the edge ring 25 and an upper surface of the sealing member 26.

As described above, according to the substrate processing apparatus in the fifth embodiment, as illustrated in FIG. 6, the sealing member 26 can prevent radicals generated in the space between the lower electrode 18 and the upper electrode 30 from reaching the first bonding layer 23 and the second bonding layer 24. This prevents the first bonding layer 23 and the second bonding layer 24 from deteriorating due to radicals. Therefore, it is possible to prevent the first and second electrostatic chucks 21 and 22 from peeling away from the lower electrode 18.

The gap between the bottom surface of the edge ring 25 and the upper surface of the sealing member 26 can prevent the sealing member 26 from applying force to the edge ring 25 to lift the edge ring 25 from the second electrostatic chuck 22.

In addition, a cross-sectional shape of the sealing member 26 is substantially circular, and is disposed in a rectangular space in a cross-sectional view. Thus, in a case in which volume of the sealing member 26 increases due to its thermal expansion, the increased volume of the sealing member 26 can expand in directions of four corners of the rectangular space. Thus, the sealing member 26 is prevented from applying force to the edge ring 25 to lift the edge ring 25 from the second electrostatic chuck 22 due to the thermal expansion of the sealing member 26.

Although the embodiments of the substrate processing apparatus 1 have been described, the present disclosure is not limited to the above-described embodiments, and various modifications and enhancements can be made within an extent of the gist of the present disclosure as claimed.

With respect to the stage 14 of the substrate processing apparatus 1 according to the first embodiment, the edge ring 25 is provided with the projecting portion 253 that narrows the gap between the first electrostatic chuck 21 and the edge ring 25. Similarly, in the stages 14A to 14D of the substrate processing apparatus 1 according to the other embodiments, a projecting portion may be provided on the edge ring 25.

The substrate processing apparatus 1 is described as a plasma processing apparatus that generates a plasma in the interior space 10s, but the substrate processing apparatus 1 is not limited thereto. The substrate processing apparatus 1 may be an ALD (Atomic Layer Deposition) device or a thermal CVD (Chemical Vapor Deposition) device. In this case, the sealing member 26 can prevent a process gas supplied to the interior space 10s from flowing into the first and second bonding layers 23 and 24. Thus, for example, deterioration of the bonding layers 23 and 24 that is caused by a reaction of the process gas with the bonding layers 23 and 24 can be suppressed.

The substrate processing apparatus 1 disclosed herein is applicable to any type of substrate processing apparatus including a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

What is claimed is:

1. A stage comprising:
    a base;
    a substrate mount section provided above an upper surface of the base;
    an annular member mount section provided above the upper surface of the base, so as to surround a periphery of the substrate mount section;
    a first bonding layer bonding the base and the substrate mount section;
    a second bonding layer bonding the base and the annular member mount section;
    an annular member disposed on the annular member mount section; and
    a sealing member configured to protect the first bonding layer and the second bonding layer,
    wherein the sealing member is configured to seal a path from a gap between the substrate mount section and the annular member to the first bonding layer, and to seal a path from the gap between the substrate mount section and the annular member to the second bonding layer.

2. The stage according to claim 1, wherein the annular member is formed to cover the annular member mount section from an inside of the annular member mount section in a radial direction of the annular member.

3. The stage according to claim 1, wherein the sealing member is made of an elastic material; and
the sealing member exerts restoring force on the annular member outwardly in a radial direction of the annular member and downwardly in a vertical direction perpendicular to the radial direction.

4. The stage according to claim 1, wherein the annular member mount section is an electrostatic chuck configured to hold the annular member.

5. The stage according to claim 1, wherein the annular member includes a projecting portion that narrows a gap between the substrate mount section and the annular member.

6. The stage according to claim 1, wherein the sealing member abuts at least the substrate mount section and the annular member.

7. The stage according to claim 1, wherein the sealing member abuts at least the substrate mount section and the annular member mount section.

8. The stage according to claim 1, further comprising a heat transmitting gas supply line configured to supply a heat transmitting gas to a gap between the annular member mount section and the annular member.

9. A substrate processing apparatus comprising the stage according to claim 1.

10. The stage according to claim 2, wherein the sealing member is made of an elastic material; and
the sealing member exerts restoring force on the annular member outwardly in a radial direction of the annular member and downwardly in a vertical direction perpendicular to the radial direction.

11. The stage according to claim 10, wherein the annular member mount section is an electrostatic chuck configured to hold the annular member.

12. The stage according to claim 11, wherein the annular member includes a projecting portion that narrows the gap between the substrate mount section and the annular member.

13. The stage according to claim 12, further comprising a heat transmitting gas supply line configured to supply a heat transmitting gas to a gap between the annular member mount section and the annular member.

14. The stage according to claim 10, wherein the sealing member abuts at least the substrate mount section and the annular member.

15. The stage according to claim 14, further comprising a heat transmitting gas supply line configured to supply a heat transmitting gas to a gap between the annular member mount section and the annular member.

16. The stage according to claim 7, further comprising a heat transmitting gas supply line configured to supply a heat transmitting gas to a gap between the annular member mount section and the annular member.

17. A stage comprising:
a base;
a substrate mount section provided above an upper surface of the base;
an annular member mount section provided above the upper surface of the base, so as to surround a periphery of the substrate mount section;
a first bonding layer bonding the base and the substrate mount section;
a second bonding layer bonding the base and the annular member mount section;
an annular member disposed on the annular member mount section; and
a sealing member configured to protect the first bonding layer and the second bonding layer,
wherein the sealing member abuts at least the substrate mount section and the annular member.

18. A stage comprising:
a base;
a substrate mount section provided above an upper surface of the base;
an annular member mount section provided above the upper surface of the base, so as to surround a periphery of the substrate mount section;
a first bonding layer bonding the base and the substrate mount section;
a second bonding layer bonding the base and the annular member mount section;
an annular member disposed on the annular member mount section; and
a sealing member configured to protect the first bonding layer and the second bonding layer,
wherein the sealing member abuts at least the substrate mount section and the annular member mount section.

* * * * *